(12) United States Patent
Crippa et al.

(10) Patent No.: US 7,301,354 B2
(45) Date of Patent: Nov. 27, 2007

(54) CONTACT PROBE FOR A TESTING HEAD HAVING VERTICAL PROBES FOR SEMICONDUCTOR INTEGRATED DEVICES

(75) Inventors: Giuseppe Crippa, Merate (IT); Stefano Felici, Robbiate (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 13 days.

(21) Appl. No.: 10/963,985

(22) Filed: Oct. 12, 2004

(65) Prior Publication Data

US 2005/0110506 A1    May 26, 2005

(30) Foreign Application Priority Data

Oct. 13, 2003   (EP) .................................. 03425664

(51) Int. Cl.
   *G01R 31/02*   (2006.01)

(52) U.S. Cl. ..................................................... 324/754
(58) Field of Classification Search ................ 324/754, 324/761, 762, 765, 158.1; 439/482, 66, 219, 439/169
See application file for complete search history.

(56) References Cited

U.S. PATENT DOCUMENTS

| 4,027,935 | A | | 6/1977 | Byrnes et al. ................. 339/48 |
| 5,952,843 | A | * | 9/1999 | Vinh ........................... 324/761 |
| 6,300,783 | B1 | | 10/2001 | Okubo et al. ................ 324/761 |
| 6,459,287 | B1 | * | 10/2002 | Nightingale et al. ........ 324/754 |
| 6,507,207 | B2 | * | 1/2003 | Nguyen ....................... 324/761 |
| 6,847,221 | B2 | * | 1/2005 | Kimoto et al. .............. 324/762 |
| 6,853,208 | B2 | * | 2/2005 | Okubo et al. ................ 324/758 |
| 2001/0031575 | A1 | | 10/2001 | Jurine et al. ................. 439/482 |
| 2002/0105347 | A1 | | 8/2002 | Maruyama et al. ......... 324/754 |
| 2002/0113612 | A1 | | 8/2002 | Nguyen ....................... 324/761 |

FOREIGN PATENT DOCUMENTS

| EP | 1 197 756 A2 | 4/2002 |
| FR | 2 535 064 | 4/1984 |

* cited by examiner

*Primary Examiner*—Ha Tran Nguyen
*Assistant Examiner*—Tung X. Nguyen
(74) *Attorney, Agent, or Firm*—Seed Ip Law Group PLLC

(57) ABSTRACT

A contact probe for a testing head is presented. The contact probe for a testing head has a plurality of these probes which are inserted in guide holes realized in respective dies, the probe comprising a rod-shaped body equipped at an end with at least a contact tip effective to ensure the mechanical and electrical contact with a corresponding contact pad of an integrated electronic device to be tested. The rod-shaped body has a nonuniform cross section.

42 Claims, 9 Drawing Sheets

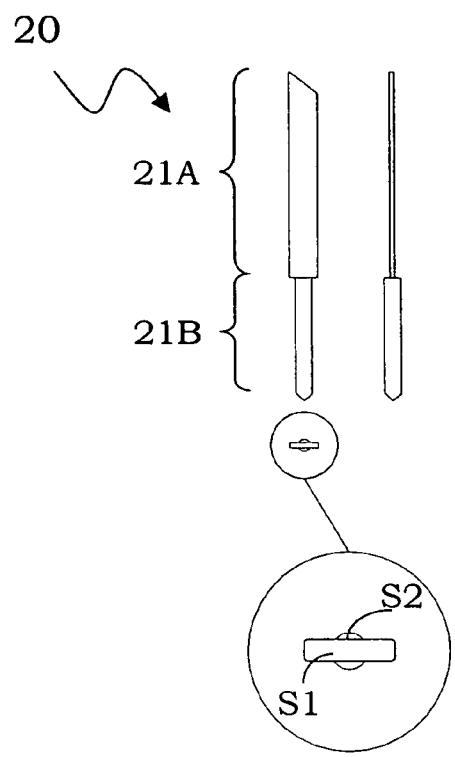
FIG. 9A
FIG. 9B
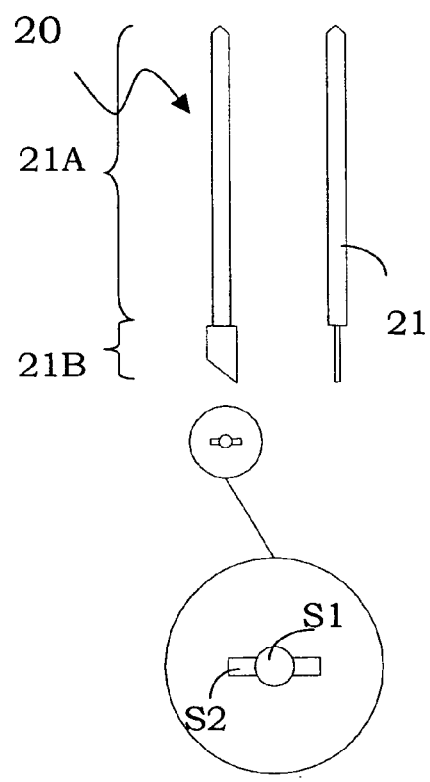
FIG. 9C
FIG. 9D

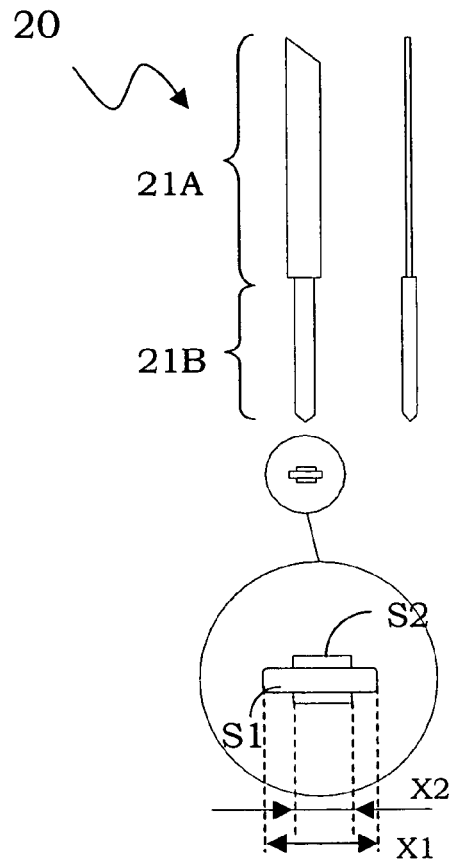
FIG. 10A
FIG. 10B
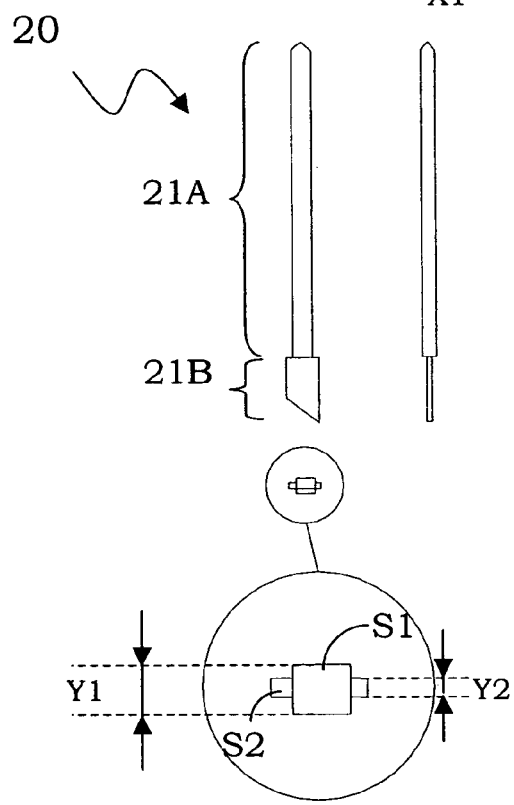
FIG. 10C
FIG. 10D

CONTACT PROBE FOR A TESTING HEAD HAVING VERTICAL PROBES FOR SEMICONDUCTOR INTEGRATED DEVICES

BACKGROUND OF THE INVENTION

1. Field of the Invention

The present invention relates to a contact probe for a testing head having vertical probes effective to test a plurality of semiconductor integrated electronic devices comprising a plurality of so-called contact pads and more particularly to a contact probe wherein a plurality of probes are inserted in guide holes realized in respective plate-like holders, or dies, the probe comprising a rod-shaped body equipped at an end with at least a contact tip effective to ensure the mechanical and electrical contact with a corresponding contact pad of an integrated electronic device to be tested.

2. Description of the Related Art

As it is well known, a testing head is essentially a device effective to electrically connect a plurality of contact pads of a semiconductor integrated electronic device with corresponding channels of a testing machine performing the test thereof.

The test performed on integrated electronic devices provides to detect and isolate defective devices already in the manufacturing step. Generally, testing heads are thus used to electrically test electronic devices integrated on semiconductor or silicon wafer before cutting and assembling them inside a chip package.

A testing head having vertical probes comprises at least a pair of parallel plates or plate-like holders located apart from each other in order to keep an air gap, as well as a plurality of suitable mobile contact elements.

Each plate, called die in the relevant technical field and in the following description, is equipped with a respective plurality of through guide holes, each hole of a plate corresponding to a hole of the other plate wherein a respective contact element or contact probe, as said element will be called in the following description and in the subsequent claims, is slidingly engaged and guided. Contact probes are generally composed of wires made of special alloys with good electrical and mechanical properties.

The good electrical connection between the probes of the testing head and the contact pads of an integrated electronic device to be tested is ensured by urging each contact probe onto the respective contact pad, mobile contact probes elastically bending in the air gap between the two dies.

These testing heads are generally called "vertical probe".

In essence, known testing heads have an air gap wherein a probe bending occurs, this bending being helped through a convenient configuration of the probes themselves or of the dies thereof, as schematically shown in FIG. 1.

In this FIG. 1 a testing head 1 comprises at least an upper die 2 and a lower die 3, having respective upper 4 and lower 5 through guide holes wherein a contact probe 6 is slidingly engaged.

The contact probe 6 has at least a contact end or tip 7. In particular, the contact tip 7 is mechanically contacted with a contact pad 8 of an integrated electronic device to be tested, said integrated electronic device meanwhile electrically contacting a testing equipment (not shown) of which this testing head is a terminal element.

Upper 2 and lower 3 dies are spaced by an air gap 9 allowing contact probes 6 to be deformed or sloped during the testing head normal operation, i.e. when this testing head comes into contact with the integrated electronic device to be tested. Moreover upper 4 and lower 5 guide holes are sized in order to guide the contact probe 6.

FIG. 1 shows a testing head 1 with unblocked probes, i.e. being capable of sliding in respective upper 4 and lower 5 guide holes, associated with a micro-contact strip or space transformer, schematically indicated with 10.

In this case, contact probes 6 have a further contact tip towards a plurality of contact pads 11 of the space transformer 10, the good electrical contact between the probes and the space transformer 10 being ensured similarly to the contact with the integrated electronic device to be tested by urging the probes 6 onto the contact pads 11 of the space transformer 10.

In particular, according to the technology known as Cobra, contact pads 6 have a pre-deformed configuration with an offset d between the end in contact with the contact pads 11 of the space transformer 10 and the contact tip 7 on the contact pads 8 of the integrated electronic device to be tested, as schematically shown in FIG. 2.

The pre-deformed configuration, also in case the testing head 1 is not in contact with the integrated electronic device to be tested, favors the correct bending of the probe 6 during the operation thereof, i.e. during the contact with the integrated electronic device to be tested.

Moreover, a thin and flexible insulating material film 12, generally realized in polyimide, is interposed between the upper die 2 and the lower die 3, able to keep the upper end of the contact probes 6 in place during the assembly step.

In particular, the assembly step of a testing head 1 realized according to the Cobra technology is particularly delicate. It comprises the following steps:

each contact probe 6 is inserted from the corresponding side to the contact tip 7 in a hole in the lower die 3, as schematically shown in FIG. 3;

the other end of contact probes 6 is softly forced into the conveniently drilled flexible material film 12, so that it is held by this material film 12 without risking to exit therefrom, as schematically shown in FIG. 4, and once all contact probes 6 are inserted in the flexible material film 12 as described, the upper die 2 is applied, centering with great skill all contact probes 6 in the corresponding holes realized in the upper die 2, as schematically shown in FIG. 5.

This assembly mode required by the probes realized according to the Cobra technology is very long, besides being risky for possible probe deformations and very unstable up to the locking with the upper die 2.

Moreover, there is the risk of mechanical interference between the flexible material film 12 and contact probes 6 during the normal operation of the testing head 1 since this film 12, once its task of keeping the probe 6 end in place during the assembly step is completed, nevertheless remains trapped inside the testing head 1 and it can cause serious problems to the sliding of the probes themselves, mainly for large-sized testing heads, with a high number of close probes.

It is also known to realize testing heads by using the so-called "shifted plate" technology, schematically shown in FIG. 6, the elements being structurally and functionally identical to the testing head 1 of FIG. 1 having been indicated with the same numeral references.

In this case, contact probes 6 are not pre-formed, but only realized in a straight form, with circular cross section being constant for the whole length thereof and generally pointed at the ends.

In order to achieve the correct operation of contact probes 6, the upper 2 and lower 3 dies are conveniently shifted one another to allow probes 6 to bend preferentially in a same direction.

The assembly of probes 6 in testing heads realized according to the shifted plate technology is very simple and fast and it does not require the use of any flexible material film. In particular, it is sufficient to align the upper die 2 with the lower die 3 in order to align also the corresponding guide holes 4 and 5, to insert then the contact probes 6 in the guide holes 4 and 5, to shift the dies therebetween by a convenient quantity then blocking them in position.

However, also this technology has some drawbacks, and in particular:

it is difficult to keep contact probes 6 within their housing, i.e. inside the die guide holes. In fact, despite the relative shift between the upper 2 and lower 3 dies, causing a friction between the contact probes 6 and the corresponding guide holes 4 and 5, this friction is not always sufficient to keep probes in place.

In particular, the risk of exit of contact probes 6 is much higher during the maintenance and cleaning operations of the testing head 1, operations which are generally performed with air blows or ultrasounds and which thus create mechanical stresses on contact probes 6, favoring the exit thereof from guide holes.

The distance between two adjacent probes of the testing head 1 is limited because of the circular cross section of the wire realizing the contact probes 6.

In particular, testing heads have intrinsic distance limits between two adjacent probes, and thus between the centers of two contact pads of the integrated electronic device to be tested, known in this field as "pitch". In particular, the minimum "pitch" value depends on the probe geometrical configuration and size. In order to avoid the contact between adjacent probes, the testing head 1 must satisfy the following relation:

$$P > \emptyset F + G1$$

being:

P the pitch value of the device to be tested, i.e. the distance between the centers of two adjacent contact pads;

ØF the diameter of the contact probes 6; and

G1 the safety distance between adjacent contact probes 6.

The condition G1=0, i.e. the annulment of the safety distance, corresponds to the probe collision.

In the case of circular probes, the minimum pitch P1 is given by the probe diameter ØF corresponding to the diameter of the guide holes increased by the thickness G1 of the wall separating two adjacent holes, as schematically shown in FIG. 7.

The need to keep a minimum distance pitch value between the probes is thus in contrast with the present market need, which pushes to design denser and denser devices and thus requires testing heads with a higher and higher number of contact probes for testing these devices.

SUMMARY OF THE INVENTION

Embodiments of this invention provide contact probes having a configuration effective to reduce the minimum pitch required by the devices to be tested and meanwhile the risk for contact probes to exit from guide holes.

One of the principles on which embodiments of the present invention stand is that of providing a non-constant cross section contact probe, capable of allowing probes to be conveniently approached and ensuring meanwhile a reduction of the risks for probes to exit from guide holes.

Presented is a contact probe for a testing head having a plurality of probes which are inserted in guide holes realized in respective plate-like holders, or dies, the probe comprising: a rod-shaped body equipped at an end with a contact tip effective to ensure mechanical and electrical contact with a corresponding contact pad of an integrated electronic device to be tested, wherein the rod-shaped body has a non-uniform cross section.

Additionally presented is a testing head including: an upper die having a plurality of guide holes; a lower die having a plurality of guide holes; and a plurality of contact probes inserted in the guide holes of the upper and lower dies, wherein the contact probes comprise a rod-shaped body equipped at an end with a contact tip effective to ensure mechanical and electrical contact with a corresponding contact pad of an integrated electronic device to be tested, the rod-shaped body having a non-uniform cross section.

Also presented is a method for obtaining a contact probe with a non-uniform cross section. The method includes the steps of:

providing a wire having a predetermined profile cross section effective to realize a rod-shaped body of the contact probe; and deforming the wire in correspondence with at least a portion of the rod-shaped body, obtaining a cross section with different profile with respect to the predetermined profile of the wire.

The features and advantages of the contact probe and testing head according to the invention will be apparent from the following description of embodiments thereof given by way of non-limiting example with reference to the attached drawings.

BRIEF DESCRIPTION OF THE DRAWINGS

FIGS. 9A to 9D are cross-sectional and top plan views of a contact probe according to another embodiment of the invention;

FIGS. 10A to 10D are cross-sectional and top plan views of a contact probe according to a further embodiment of the invention;

DETAILED DESCRIPTION OF THE INVENTION

With reference to FIGS. 8A to 8D, a contact probe according to an embodiment of the invention is indicated with 20.

The contact probe 20 has a rod-shaped body 21 equipped with at least a contact end or tip 22. In particular, as seen with reference to the prior art, the contact tip 22 is in mechanical contact with a contact pad of an integrated electronic device to be tested, said integrated electronic device meanwhile being electrically contacted with a testing equipment (not shown) of which this testing head is a terminal element.

Moreover, for example in the case of probes for a testing head having unblocked probes, associated with a micro-contact strip or space transformer, the contact probe 20 has a second contact tip 23 towards a plurality of contact pads of this space transformer. This is given by way of non-limiting example of a testing head according to an embodiment of the invention.

Advantageously according to an embodiment of the invention, the rod-shaped body 21 of the contact probe 20 has a non-uniform cross section with respect to a main development line LL thereof.

Figure 1:
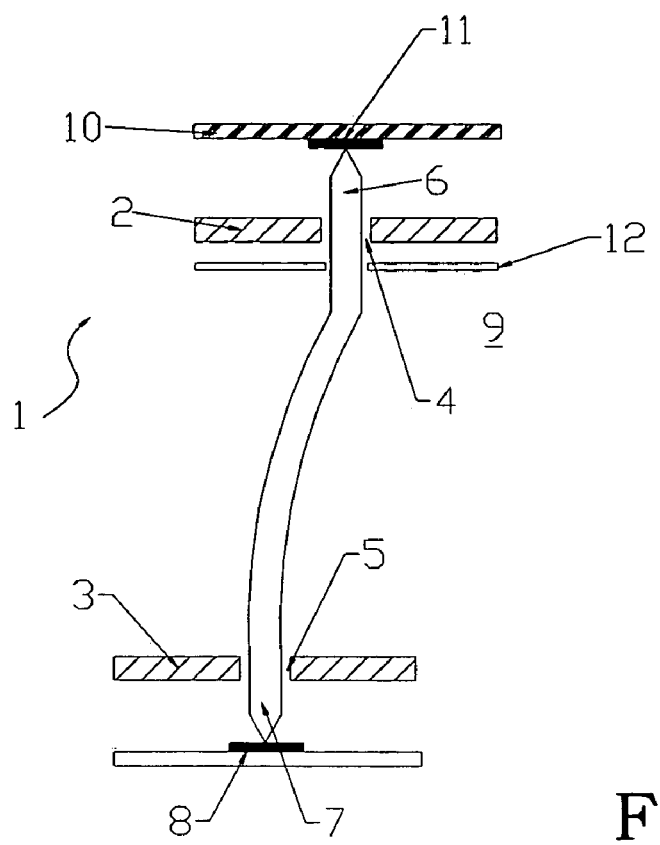
FIG. 1 is a cross-sectional view of a testing head according to an embodiment of the prior art.
Figure 2:
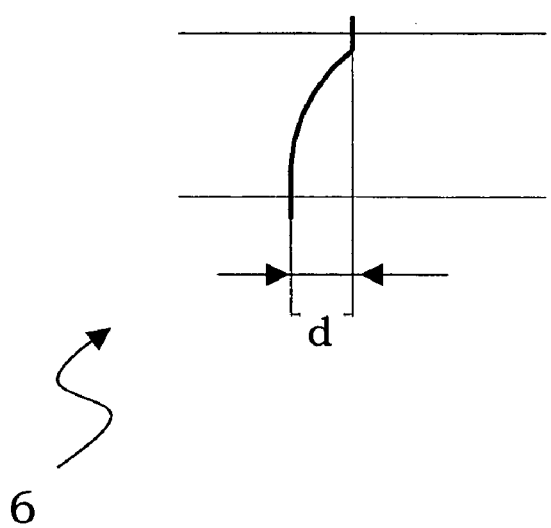
FIG. 2 is a schematic view of a testing head according to the embodiment of FIG. 1.
Figure 3:
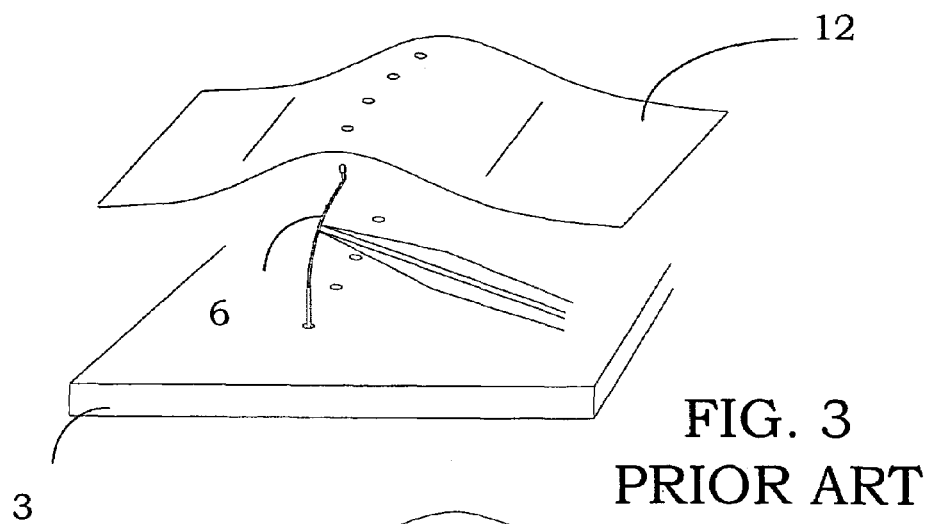
FIGS. 3 to 5 are schematic views of a testing head according to the embodiment of FIG. 1 during different assembly operations.
Figure 4:
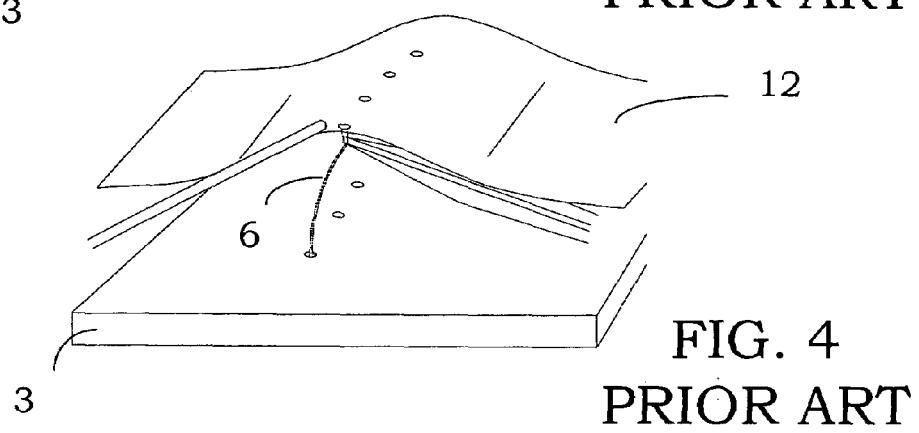
Figure 5:
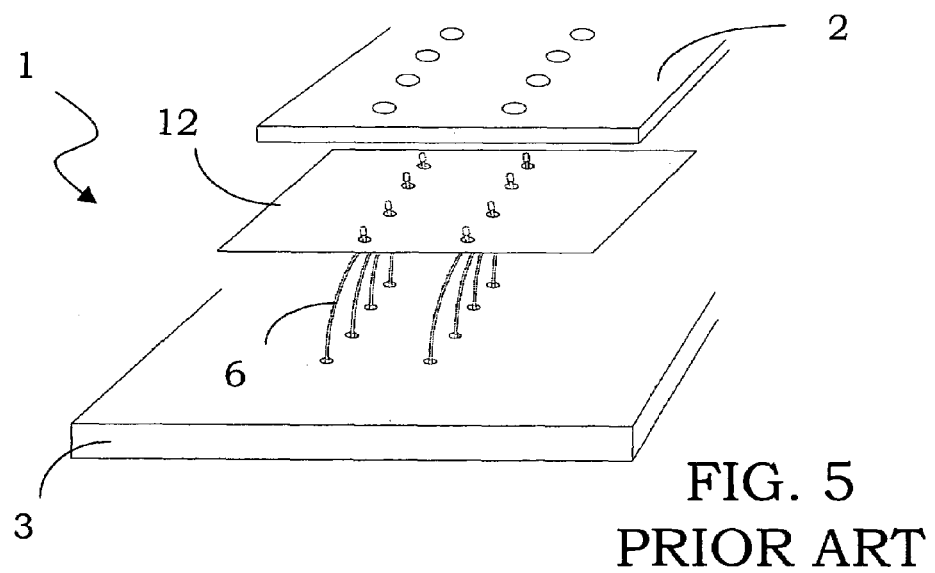
Figure 6:
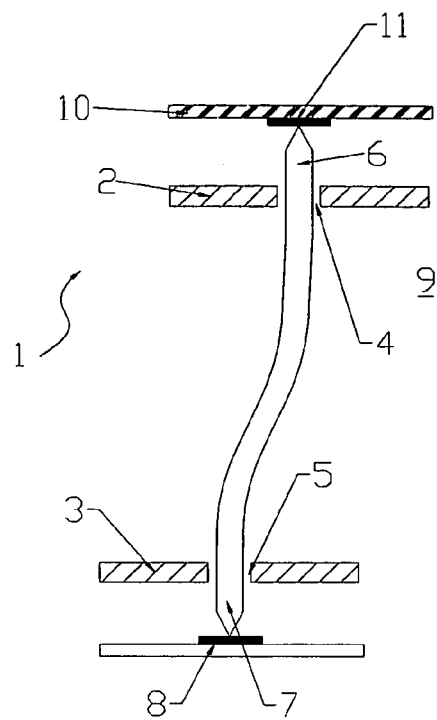
FIG. 6 is a cross-sectional view of a testing head according to another embodiments of the prior art.
Figure 7:
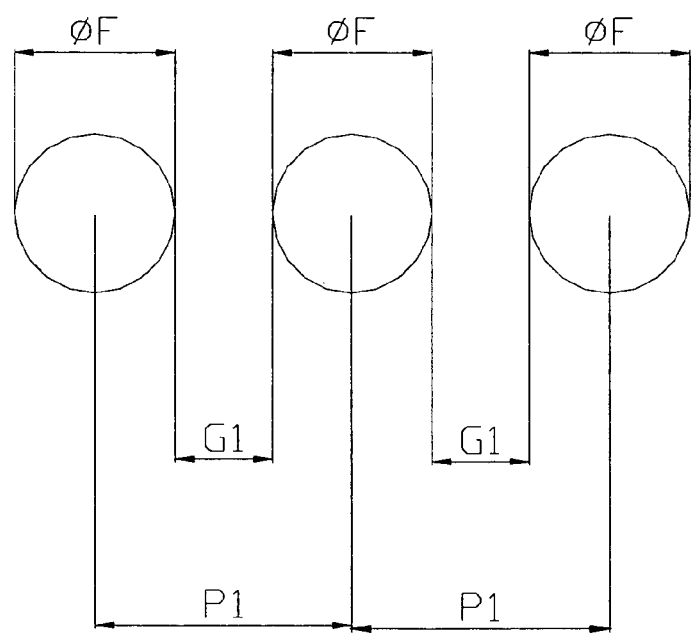
FIG. 7 is a top plan view of a testing head according to the embodiment of FIG. 6, showing significant dimensions.
Figure 8A:
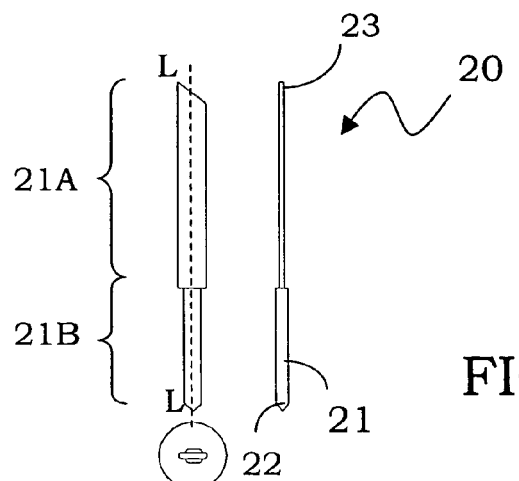
FIGS. 8A to 8D are cross-sectional and top plan views of a contact probe according to an embodiment of the invention.
Figure 8B:
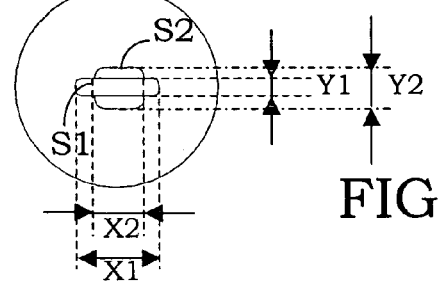

In particular, the rod-shaped body 21 of the contact probe 20 has at least a first portion 21A and a second portion 21B having cross sections S1 and S2 of different profile, as shown in enlarged scale in FIG. 8B.

Advantageously according to an embodiment of the invention, the first cross section S1 has at least a higher dimension than a corresponding dimension of the second cross section S2, to prevent the contact probe 20 from exiting from the guide holes realized in the dies, as it will be better seen hereafter.

In particular, as it can be noted in FIG. 8B, the first section S1 of the portion 21A has a longitudinal dimension X1 being higher than a corresponding longitudinal dimension X2 of the second section S1 (X1>X2). Moreover, the first section S1 has a longitudinal dimension Y1 being lower than a corresponding longitudinal section Y2 of the second section S2 (Y1<Y2).

Figure 8C:
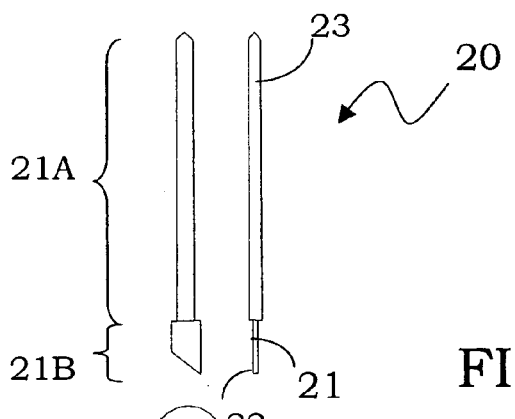
Figure 8D:
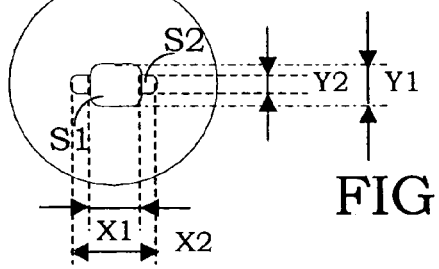

It is also possible to consider a contact probe 20 as shown in FIGS. 8C and 8D for which the portion 21B near the contact tip has, dually to the probe shown in FIGS. 8A and 8B, the first section S1 with a longitudinal dimension X1 being lower than the corresponding longitudinal dimension X2 of the second section S2 (X1<X2) and the longitudinal dimension Y1 being higher than the corresponding longitudinal dimension Y2 of the second section S2 (Y1>Y2).

Advantageously according to an embodiment of the invention, it is possible to obtain a contact probe 20 with non-uniform cross section starting from a probe realized in a traditional way by means of a circular cross section wire. This circular cross section wire is flattened at two different thicknesses in correspondence with the portions 21A and 21B of the rod-shaped body 21 of the contact probe 20 thus obtaining a contact probe 20 having a first S1 and a second S2 substantially rectangular cross section with rounded edges.

It is also possible, according to another embodiment of the invention, to flatten the wire only in correspondence with one of the portions 21A or 21B of the rod-shaped body 21, for example in correspondence with the first portion 21A thus obtaining a first rectangular cross section S1 with rounded edges and a second circular cross section S2, as schematically shown in FIGS. 9A and 9B. Similarly it is possible to flatten the wire only in correspondence with the portion 21B, thus obtaining a first circular cross section S1 and a second rectangular cross section S2 with rounded edges, as schematically shown in FIGS. 9C and 9D.

Similarly it is possible to obtain a non-uniform cross section contact probe 20 according to a further embodiment of the invention starting from a probe having a rectangular cross section and flattening a portion thereof, thus obtaining a contact probe 20 having a first S1 and a second S2 rectangular cross section, as schematically shown in FIGS. 10A and 10B and in FIGS. 10C and 10D.

In particular, the section of the contact probe 20 in correspondence with the contact tip 23 towards the space transformer has however a profile having at least a dimension being higher than a corresponding dimension of the profile of the contact probe 20 section in correspondence with the contact tip 22 towards the device to be tested.

In fact, as shown in FIG. 10B, the cross dimension X1 of the first section S1 is higher than the cross dimension X2 of the second section S2 and, as shown in FIG. 10D, the longitudinal dimension Y1 of the first section S1 is higher than the longitudinal dimension Y2 of the second section S2.

More generally, the contact probe 20 according to some other embodiments of the invention has two or more cross sections of any shape, but different from each other, obtained with the several presently available technologies.

In a preferred embodiment of the invention, the contact probe 20 is obtained with a method comprising the following steps:
  providing a wire effective to realize the rod-shaped body 21 of the contact probe 20; and
  deforming, for example by flattening, this wire in correspondence with at least a portion 21A or 21B in order to obtain in this portion a cross section with different profile with respect to the profile of the wire cross section and thus a non uniform cross section contact probe 20.

Moreover, the method according to another embodiment of the invention can comprise a flattening step of further portions of the rod-shaped body 21 of the contact probe 20.

Advantageously according to a further embodiment of the invention, the non uniform cross section contact probe 20 allows the problem linked to the probe exit, affecting the known shifted plate vertical technologies, to be solved.

In fact, as seen with reference to the prior art, according to this shifted plate technology, contact probes with circular guide holes realized in the upper and lower dies are generally provided. Therefore, these guide holes do not ensure that contact probes are retained inside a testing head. Probes tend to slide out of the respective guide holes, in particular during cleaning operations, usually performed by means of air blows or cleaning in liquid solutions with ultrasounds.

Figure 11A:
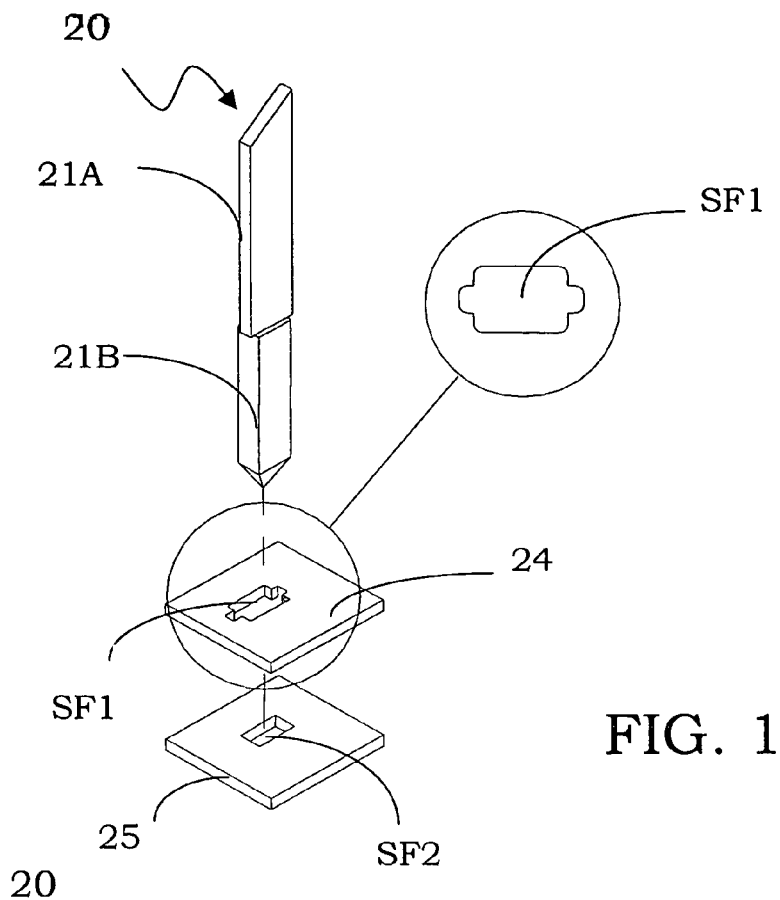
FIGS. 11A and 11B are perspective views of a testing head according to an embodiment of the invention.
Figure 11B:
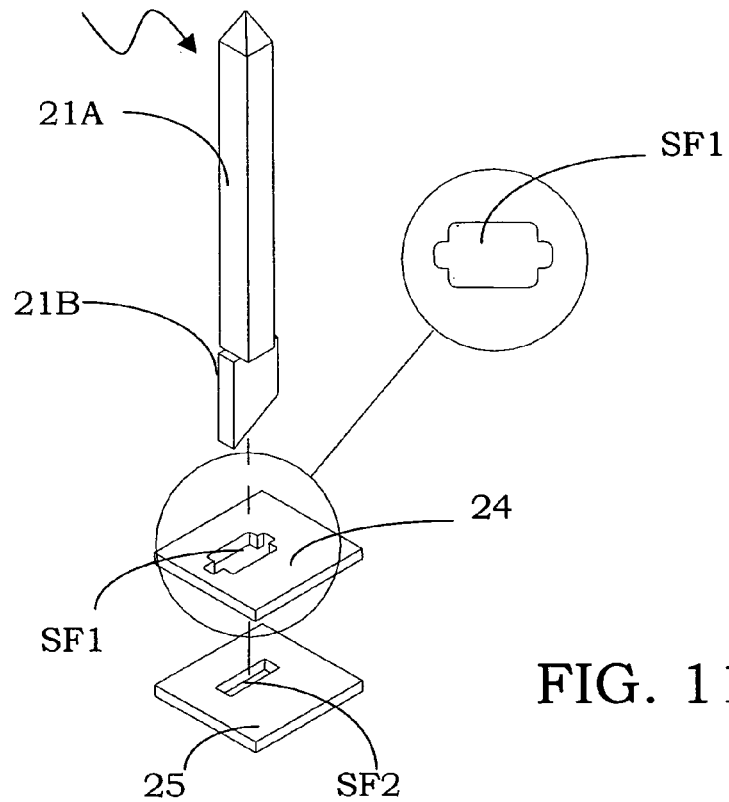

Advantageously according to an embodiment of the invention, the nonuniform cross section contact probe 20 is associated with a convenient hole with different profile between an upper die 24 and a lower die 25 of the testing head, as schematically shown in FIGS. 11A and 11B. In particular, the lower die 25 has holes having a cross section SF2 whose profile substantially corresponds to the profile of the second cross section S2 of the second portion 21B of the contact probe 20, while the upper die 24 has holes having a cross section SF1 whose profile corresponds to the union of the profiles of cross sections S1 and S2 of portions 21A and 21B of the contact probe 20.

In this way, it is ensured that contact probes 20 are retained inside the dies of a testing head comprising these dies and a plurality of contact probes 20. In fact, each contact probe 20 cannot move because of the holes of the lower die 25, having a cross section with at least a dimension being lower than the corresponding dimension of the cross section of at least one portion 21A of the contact probe 20.

In other words, the so-obtained testing head has a preferred exit direction of contact probes 20, particularly from the lower die 25 towards the upper die 24, any movement in the opposite direction being prevented by the guide holes of the lower die 24 being conveniently shaped and having at least a dimension being lower than a corresponding dimension of the section profile of the probe portion 21A.

A more reliable testing head is thus obtained, allowing washings and cleanings while preventing contact probes 20 from exiting from the testing head itself. To this purpose it is sufficient to use a gas blow pushing the contact probes 20 towards the lower die 25, wherefrom they cannot exit, or by blocking the probe exit from the upper die by means of a convenient cap it is possible to perform any washing and cleaning without any risk of probe exit in any of the two directions.

Advantageously, the non-uniform cross section contact probe 20 also allows the problem linked to the assembly of the testing head comprising them to be solved.

In particular, it is sufficient to overlap the upper 24 and lower 24 dies and the corresponding guide holes and to insert contact probes 20 in the overlapped guide holes simply by starting from the upper die 24 towards the lower die 25.

It is thus sufficient to space the upper and lower dies, contact probes 20 being allowed to slide in the guide holes of the upper die 24.

The testing head assembly according to an embodiment of the invention is completed by blocking the upper 24 and lower 25 dies in the spaced position, providing in case the shift thereof one another or the insertion of a spacer 26 between the dies before blocking them.

It can be immediately noticed that this assembly technique is faster and safer than the assembly technique used in the known technique, for example in Cobra technologies.

In practice, the described assembly of a testing head comprising a plurality of non-uniform cross section contact probes 20 has a considerably reduced execution time, besides being simpler and more reliable.

Finally, advantageously, the non-uniform cross section contact probe 20 allows the problem linked to the minimum pitch required by the device to be tested to be solved.

As previously seen for the existing technologies, the minimum pitch value of a device to be tested is limited by the fact that the cross section of the wire realizing contact probes is circular. In fact, the minimum pitch value is given by the diameter of guide holes increased by the thickness G1 of the separation wall between two adjacent holes, as schematically shown in FIG. 12A in the case of contact probes realized according to the prior art.

Figures 12A, 12B:
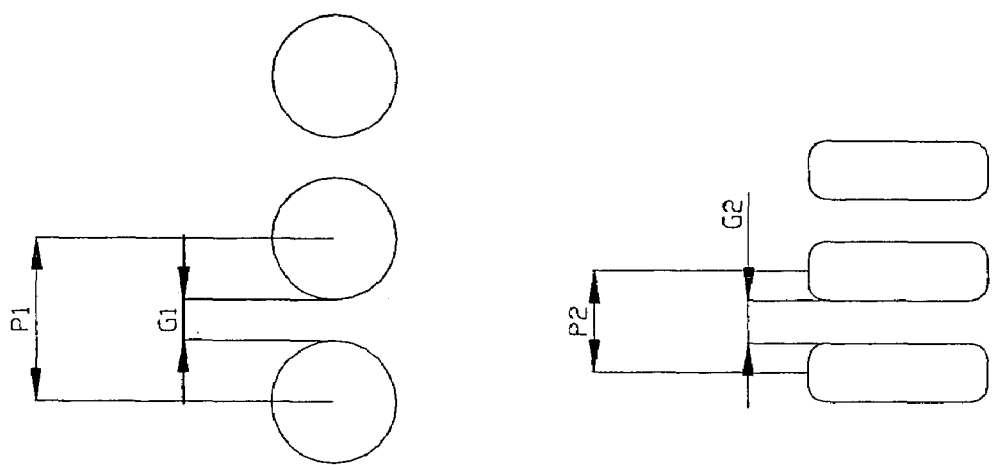
FIGS. 12A and 12B are top plan views of different arrangements of a testing head according to other embodiments of the invention.

Advantageously, the non-uniform cross section contact probe 20 allows the minimum pitch to be reduced by a quantity being equal to the reduction of the cross section between the cross sections S1 and S2 of the rod-shaped body 21 of the contact probe 20, as schematically shown in FIG. 12B.

Figure 13A:
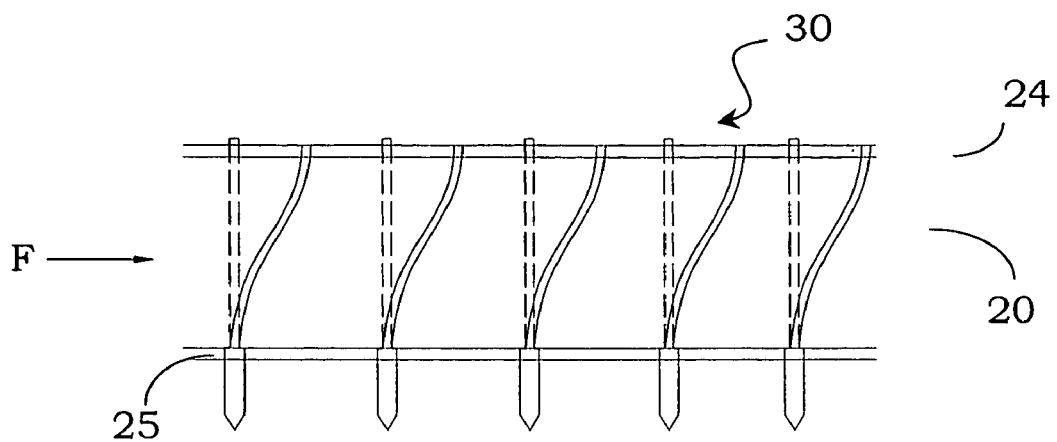
FIGS. 13A and 13B are cross-sectional views of a testing head according to an embodiment of the invention in different assembly steps.
Figure 13B:
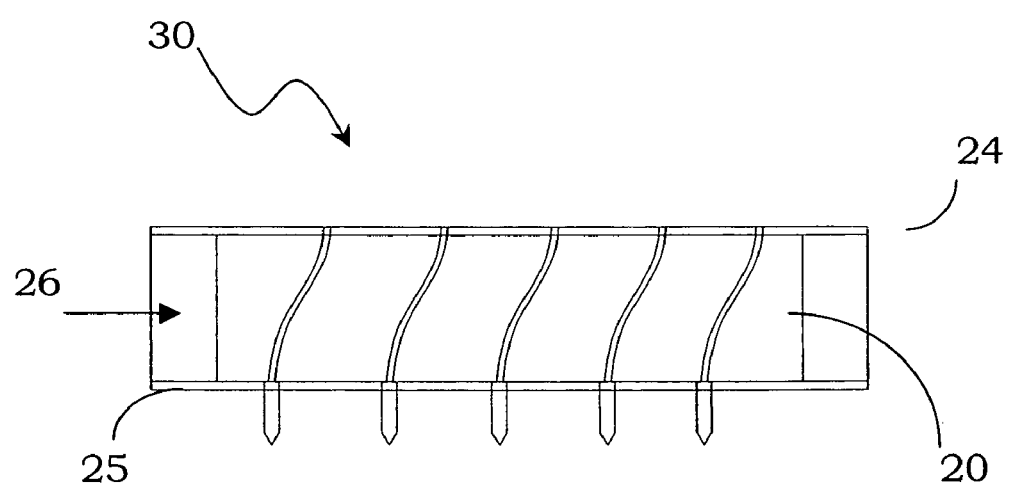

FIGS. 13A and 13B show, by way of example, a testing head 30 realized in the shifted plate technology and comprising a plurality of contact probes 20 according to an embodiment of the invention.

In particular, after assembling the contact probes 20 between the upper die 24 and the lower die 25, a shift of these dies is applied to allow probes to bend, as schematically indicated in FIG. 13A by means of an arrow F. In this way, contact probes 20 have a preferred bending direction.

Moreover, it is possible to provide a spacer 26, sometimes indicated as housing or spacer, of variable height, in order to allow the forces in the bending step to be correctly adjusted, as schematically shown in FIG. 13B.

In a preferred embodiment of the invention, the dies of the testing head, and particularly at least the lower die 25, comprise very long guide holes. These guide holes can be obtained by increasing the thickness of the die itself or, in a simpler way, by using two or more thin dies overlapped to each other or also by using two very thin dies (and thus very easy to be drilled) located apart. It is thus possible to obtain long guide holes substantially aligned with each other.

In the case of the shifted plate technology, to help contact probes 20 to bend in a preferred direction, it is also possible to use guide holes obtained with offset drillings. Also in this case, the guide holes can be obtained by using two or more dies overlapped to each other or located apart, wherein holes are drilled slightly offset with each other.

In conclusion, advantageously according to embodiments of the invention, the nonuniform cross section contact probe 20 allows the following problems to be solved:
  probe exit, as seen with reference to known shifted plate vertical technologies;
  assembly, as seen with reference to known "Cobra" technologies;
  allowed minimum pitch and good electrical contact.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

The invention claimed is:

1. A testing head comprising:
  an upper die having a plurality of guide holes;
  a lower die having a plurality of guide holes; and
  a plurality of contact probes inserted in the guide holes of the upper and lower dies, wherein the contact probes comprise a rod-shaped body equipped at an end with a contact tip effective to ensure mechanical and electrical contact with a corresponding contact pad of an integrated electronic device to be tested, the rod-shaped body having a non-uniform cross section, wherein the upper die has cross sectional holes having a profile corresponding to the union of profiles of different cross sections of the contact probes, wherein the rod-shaped body has a first portion and a second portion with respective first and second cross sections of different profile, wherein the first cross section is taken orthogonally with respect to a first central axis through the first portion and the second cross section is taken orthogonally with respect to a second central axis through the second portion.

2. The testing head of claim 1, wherein the rod-shaped body has a first portion and a second portion having respective first and second cross sections of different profile.

3. The testing head of claim 2, wherein the first cross section has a dimension higher than a corresponding dimension of the second cross section.

4. The testing head of claim 2, wherein the first and second cross sections are rectangular with rounded edges.

5. The testing head of claim 2, wherein the first cross section is circular and said second cross section is rectangular with rounded edges.

6. The testing head of claim 2, wherein the first and second cross sections are rectangular.

7. The testing head of claim 1, wherein the lower die has cross sectional holes having a profile substantially corresponding to the profile of a cross section of the contact probes.

8. The testing head of claim 1, wherein the profile of the cross section of the holes is given by the union of two rectangular profiles with rounded edges.

9. The testing head of claim 1, wherein the profile of the cross section of the holes is given by the union of a circular profile and of a rectangular profile with rounded edges.

10. The testing head of claim 1, wherein the profile of the cross section of the holes is given by the union of two rectangular profiles.

11. The testing head of claim 1, wherein the upper and lower dies are offset with each other.

12. The testing head of claim 1, further comprising a spacer between the upper and lower dies.

13. The testing head of claim 1, wherein the dies have long holes.

14. The testing head of claim 13, wherein the dies are realized with a raised thickness, by overlapping a plurality of thin dies or by a pair of thin dies conveniently spaced from each other.

15. The testing head of claim 14, wherein the dies have guide holes offset with each other.

16. A testing head comprising:
an upper die and a lower die each comprising a plurality of guide holes; and
a plurality of contact probes inserted in the plurality of guide holes and comprising a rod-shaped body having a non-uniform cross section,
the rod-shaped body being provided with a contact tip effective to ensure mechanical and electrical contact with a corresponding contact pad of an integrated electronic device to be tested,
wherein the rod-shaped body has a first portion and a second portion with respective first and second cross sections of different profile, wherein the first cross section is taken orthogonally with respect to a first central axis through the first portion and the second cross section is taken orthogonally with respect to a second central axis through the second portion, wherein the upper die has cross sectional holes having a profile corresponding to the union of profiles of the first and second cross sections of the rod-shaped body.

17. The testing head of claim 16, wherein the first cross section has a dimension being higher than a corresponding dimension of the second cross.

18. The testing head of claim 17, wherein the first and second cross sections are rectangular with rounded edges.

19. The testing head of claim 17, wherein the first cross section is circular and said second cross section is rectangular with rounded edges.

20. The testing head of claim 17, wherein the first and second cross sections are rectangular.

21. The testing head of claim 16, wherein the lower die has cross sectional holes having a profile substantially corresponding to the profile of a cross section of the contact probes.

22. The testing head of claim 16, wherein the upper die has cross sectional holes having a profile corresponding to the union of the profiles of different cross sections of the contact probes.

23. The testing head of claim 22, wherein the profile of the cross section of the holes is given by the union of two rectangular profiles with rounded edges.

24. The testing head of claim 22, wherein the profile of the cross section of the holes is given by the union of a circular profile and of a rectangular profile with rounded edges.

25. The testing head of claim 22, wherein the profile of the cross section of the holes is given by the union of two rectangular profiles.

26. The testing head of claim 16, wherein the upper and lower dies are offset with each other.

27. The testing head of claim 16, further comprising a spacer between the upper and lower dies.

28. The testing head of claim 16, wherein the dies have long holes.

29. The testing head of claim 28, wherein the dies are realized with a raised thickness, by overlapping a plurality of thin dies or by a pair of thin dies conveniently spaced from each other.

30. The testing head of claim 29, wherein the dies have guide holes offset with each other.

31. A testing head, comprising:
an upper die having a guide hole;
a lower die having a guide hole; and
a contact probe inserted in the guide holes of the upper and lower dies, the contact probe including a first portion with a first cross section sized and shaped to movingly fit within the guide hole of the lower die and a second portion with a second cross section sized and shaped to not fit within the guide hole of the lower die, wherein the second cross section of the second portion is sized and shaped to fit within the guide hole of the upper die, wherein the first cross section is taken orthogonally with respect to a first central axis through the first portion and the second cross section is taken orthogonally with respect to a second central axis through the second portion.

32. The testing head of claim 31, wherein the first cross section has a dimension higher than a corresponding dimension of the second cross section.

33. The testing head of claim 31, wherein the first and second cross sections are rectangular with rounded edges.

34. The testing head of claim 31, wherein the first cross section is circular and said second cross section is rectangular with rounded edges.

35. The testing head of claim 31, wherein the first and second cross sections are rectangular.

36. The testing head of claim 31, wherein the guide hole of the lower die has a shape substantially corresponding to the shape of the first cross section.

37. The testing head of claim 31, wherein the guide hole of the upper die has a shape corresponding to a union of the shapes of the first and second cross sections.

38. The testing head of claim 31, wherein the guide holes of the upper and lower dies are offset with respect to each other such that the contact probe is bent between the upper and lower dies.

39. The testing head of claim 31, further comprising a spacer between the upper and lower dies.

40. The testing head of claim 31, wherein the first central axis is aligned with the second central axis.

41. The testing head of claim 1, wherein the first central axis is aligned with the second central axis.

42. The testing head of claim 16, wherein the first central axis is aligned with the second central axis.

* * * * *

UNITED STATES PATENT AND TRADEMARK OFFICE
CERTIFICATE OF CORRECTION

PATENT NO.         : 7,301,354 B2
APPLICATION NO.    : 10/963985
DATED              : November 27, 2007
INVENTOR(S)        : Giuseppe Crippa et al.

It is certified that error appears in the above-identified patent and that said Letters Patent is hereby corrected as shown below:

Column 9
Lines 16-18, "The testing head of claim 1, wherein the profile of the cross section of the holes is given by the union of two rectangular profiles." should read as -- The testing head of claim 1, wherein the profile of the cross section of the holes is given by the union of two rectangular profiles with rounded edges. --.

Lines 50-52, "The testing head of claim 16, wherein the first cross section has a dimension being higher than a corresponding dimension of the second cross." should read as -- The testing head of claim 16, wherein the first cross section has a dimension being higher than a corresponding dimension of the second cross sections. --.

Signed and Sealed this

Eighth Day of July, 2008

JON W. DUDAS
*Director of the United States Patent and Trademark Office*